(12) United States Patent
Sylvester et al.

(10) Patent No.: US 6,847,527 B2
(45) Date of Patent: Jan. 25, 2005

(54) INTERCONNECT MODULE WITH REDUCED POWER DISTRIBUTION IMPEDANCE

(75) Inventors: Mark F. Sylvester, Fall Creek, WI (US); David A. Hanson, Eau Claire, WI (US); William G. Petefish, Chippewa Falls, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 320 days.

(21) Appl. No.: 10/199,926

(22) Filed: Jul. 19, 2002

(65) Prior Publication Data

US 2004/0170006 A9 Sep. 2, 2004

Related U.S. Application Data

(60) Provisional application No. 60/314,905, filed on Aug. 24, 2001.

(51) Int. Cl.[7] ............................. H05K 7/06; H05K 1/03; H05K 3/42; H05K 3/46
(52) U.S. Cl. ........................ 361/763; 361/762; 361/793; 361/795; 174/255; 174/257; 174/258; 174/260; 174/262; 257/691; 29/832; 29/846; 29/852
(58) Field of Search ............................. 361/734, 738, 361/761–763, 782, 793, 794, 795, 301.2, 306.2; 174/255–258, 260, 262; 257/691; 29/832, 840, 846, 852

(56) References Cited

U.S. PATENT DOCUMENTS

| | | | | |
|---|---|---|---|---|
| 5,261,153 A | * | 11/1993 | Lucas | ............ 29/830 |
| 5,633,785 A | | 5/1997 | Parker et al. | |
| 5,635,767 A | | 6/1997 | Wenzel et al. | |
| 5,731,047 A | | 3/1998 | Noddin | |
| 5,745,334 A | * | 4/1998 | Hoffarth et al. | ............ 361/313 |
| 5,836,063 A | | 11/1998 | Hegner et al. | |
| 5,841,075 A | | 11/1998 | Hanson | |
| 5,868,590 A | | 2/1999 | Dobbelaere | |
| 5,879,787 A | | 3/1999 | Petefish | |
| 5,888,630 A | | 3/1999 | Sylvester et al. | |
| 5,888,631 A | | 3/1999 | Sylvester | |
| 5,900,312 A | | 5/1999 | Sylvester | |
| 5,912,809 A | | 6/1999 | Steigerwald et al. | |
| 5,972,231 A | * | 10/1999 | DiBene, II | ............ 216/6 |
| 5,983,974 A | | 11/1999 | Sylvester | |
| 6,011,697 A | | 1/2000 | Budnaitis et al. | |
| 6,018,196 A | | 1/2000 | Noddin | |
| 6,021,564 A | | 2/2000 | Hanson | |
| 6,103,992 A | | 8/2000 | Noddin | |
| 6,127,250 A | | 10/2000 | Sylvester et al. | |
| 6,143,401 A | | 11/2000 | Fischer et al. | |
| 6,183,592 B1 | | 2/2001 | Sylvester | |

(List continued on next page.)

FOREIGN PATENT DOCUMENTS

| | | | | |
|---|---|---|---|---|
| DE | 100 19 839 A1 | 6/2001 | ............ H01L/23/58 |
| EP | 0 889 096 A2 | 1/1999 | |
| WO | WO 00/66674 | 11/2000 | |

OTHER PUBLICATIONS

U.S. Appl. No. 09/902,302, "Capacitor Having Epoxy Dielectric Layer Cured with Aminophenylfluorenes", filed on Jul. 10, 2001.

*Primary Examiner*—John B. Vigushin
(74) *Attorney, Agent, or Firm*—Melanie G. Gover

(57) ABSTRACT

An interconnect module for an integrated circuit chip incorporates a thin, high dielectric constant embedded capacitor structure to provide reduced power distribution impedance, and thereby promote higher frequency operation. The interconnect module is capable of reliably attaching an integrated circuit chip to a printed wiring board via solder ball connections, while providing reduced power distribution impedance of less than or equal to approximately 0.60 ohms at operating frequencies in excess of 1.0 gigahertz.

63 Claims, 4 Drawing Sheets

U.S. PATENT DOCUMENTS

| | | |
|---|---|---|
| 6,203,891 B1 | 3/2001 | Noddin |
| 6,215,649 B1 * | 4/2001 | Appelt et al. ............... 361/312 |
| 6,248,959 B1 | 6/2001 | Sylvester |
| 6,333,857 B1 * | 12/2001 | Kanbe et al. ............... 361/792 |
| 6,370,013 B1 * | 4/2002 | Iino et al. ................ 361/306.3 |
| 6,388,207 B1 * | 5/2002 | Figueroa et al. ............ 174/262 |
| 6,407,929 B1 * | 6/2002 | Hale et al. .................. 361/763 |
| 6,410,858 B1 * | 6/2002 | Sasaki et al. ............... 174/255 |
| 6,441,314 B2 * | 8/2002 | Rokugawa et al. ......... 174/255 |
| 6,490,170 B2 * | 12/2002 | Asai et al. .................. 361/794 |
| 6,724,638 B1 * | 4/2004 | Inagaki et al. .............. 361/763 |

* cited by examiner

INTERCONNECT MODULE WITH REDUCED POWER DISTRIBUTION IMPEDANCE

CROSS REFERENCE TO RELATED APPLICATION

The present application is related to and claims priority from co-pending, commonly assigned U.S. Provisional Application Ser. No. 60/314,905, filed Aug. 24, 2001, entitled "Interconnect Module with Reduced Power Distribution Impedance".

TECHNICAL FIELD

The invention relates to interconnect modules for use with integrated circuit chips.

BACKGROUND

Multi-layered interconnect modules are widely used in the semiconductor industry to mechanically support integrated circuit chips and electrically attach the chips to printed wiring boards. Interconnect modules can be configured to support a single chip or multiple chips, and are typically identified by the designation SCM (single chip module) or MCM (multi-chip module).

An interconnect module provides interconnections that serve to electrically couple an integrated circuit chip to signal lines, power lines, and other components carried by a printed wiring board. In particular, the interconnect module provides interconnections that redistribute the densely packed inputs and outputs (I/Os) of the chip to corresponding I/Os on the printed wiring board. In addition to electrical interconnection, an interconnect module typically serves to mechanically couple a chip to a printed wiring board, and may perform other functions such as heat dissipation and environmental protection.

To support high frequency operation, it is important to achieve a low impedance between the chip die and the power and ground distribution lines or planes within the module. For lower frequencies, sufficiently low impedance can be achieved by placing discrete decoupling capacitors within the package and on the printed wiring board. As frequencies increase, however, it becomes increasingly difficult to achieve adequately low impedance due to the inherent series inductance produced by the discrete capacitors. In addition, leads, solder bumps, vias, plated through holes, and traces in the interconnect module compound the inability of the discrete capacitors to function adequately at higher frequencies due to increased inductance.

As an alternative to discrete capacitors, some chips include internal capacitor structures formed within the die. Specifically, an "on-chip" capacitor can be fabricated during device manufacture, and provides low inductance paths between the capacitor, the power and ground lines, and the logic and buffer circuitry. Unfortunately, on-chip capacitors significantly increase the cost of integrated circuit chips by increasing die size and decreasing yield.

Moreover, the amount of on-chip capacitance that can be added to the die is typically limited by space constraints and the dielectric constant, which must be limited in order to avoid adversely affecting signal propagation characteristics of adjacent traces. Also, the interconnection between the on-chip capacitor and a driver or receiver is usually a relatively high resistance path due to the use of high resistivity metal, e.g., aluminum. Consequently, the utility of internal capacitors is limited.

SUMMARY

In general, the invention is directed to interconnect modules that incorporate a thin, high dielectric constant capacitor structure to provide reduced impedance power and ground distribution, as well as processes for manufacturing such interconnect modules. An interconnect module constructed in accordance with the invention is capable of reliably attaching an integrated circuit chip to a printed wiring board (PWB) via solder ball connections, while providing reduced power distribution impedance of less than or equal to approximately 0.60 ohms at high operating frequencies, including frequencies in excess of 1.0 gigahertz. In this manner, the interconnect module is effective in limiting simultaneous switching output (SSO) noise, core sag, and other forms of signal degradation at very high frequencies.

An interconnect module, in accordance with the invention, may incorporate a series of alternating dielectric and conductive layers that are laminated together to form a unitary structure. The laminated interconnect structure may incorporate a number of vias and patterned signal layers that provide conductive interconnection paths between the chip, the printed wiring board, and various layers within the interconnect module. The interconnect module includes chip attach and board attach surfaces that define contact pads for attachment to corresponding pads on the chip and board, respectively, via solder balls. The various layers are selected to present coefficients of thermal expansion (CTE) that promote reliable interconnections with the chip and the PWB.

The interconnect structure achieves reduced power distribution impedance by the incorporation of one or more thin, high capacitance plane laminates that form embedded capacitors. Each embedded capacitor can be formed by an extremely thin laminate with a high dielectric constant material sandwiched between two conductive foils. The reduced thickness and high dielectric constant produce increased capacitance and reduced power and ground distribution impedance. The number of intervening layers between the chip attach surface and the capacitor, and hence the interconnect module thickness, also can be limited to reduce series inductance and further reduce power distribution impedance.

In some embodiments, the embedded capacitor may form a core of the interconnect module. In other embodiments, one or more embedded capacitors may be built around a core. In each case, the power and ground planes can be appropriately patterned either before or after the planes are incorporated in the interconnect module to accommodate vias and support controlled impedance. As an example, the embedded capacitor structure may take the form of a high dielectric constant material that is coated onto a pair of conductive foils, laminated, and patterned before incorporation in the interconnect module. In this case, the capacitor structure also may be pre-drilled to form clearance holes for vias in the interconnect module.

In one embodiment, the invention is directed to an interconnect module comprising a chip attach surface, a board attach surface, and a capacitor structure. The chip attach surface defines first contact pads for attachment of an integrated circuit chip to the interconnect module. The board attach surface defines second contact pads for attachment of the interconnect module to a printed wiring board. The capacitor structure has a first conductive layer, a second conductive layer, and a dielectric layer formed between the first and second conductive layers. Conductive paths, formed in the interconnect module, interconnect some of the first contact pads to either the first or second conductive layer. Advantageously, the first contact pads, the conductive paths, and the capacitor structure may produce a combined impedance of less than or equal to approximately 0.60 ohms at a frequency of greater than or equal to approximately 1.0 gigahertz.

In another embodiment, the invention is directed to a method for forming an interconnect module comprising providing a laminated capacitor structure, forming a chip attach surface, forming a board attach surface, and laminating the capacitor structure, chip attach surface, and board attach surface to form the interconnect module. The capacitor structure includes a first conductive layer, a second conductive layer, and a dielectric layer formed between the first and second conductive layers. The chip attach surface defines first contact pads for attachment of an integrated circuit chip to the interconnect module on a first side of the capacitor structure. The board attach surface defines second contact pads for attachment of the interconnect module to a printed wiring board on second side of the capacitor structure. The method further includes forming conductive paths that interconnect some of the first contact pads to either the first or second conductive layer. The first contact pads, the conductive paths, and the capacitor structure produce a combined impedance of less than or equal to approximately 0.60 ohms at a frequency of greater than or equal to approximately 1.0 gigahertz.

In an added embodiment, the invention provides an interconnect module comprising a laminated substrate having alternating conductive and organic dielectric layers. The laminated substrate includes at least a first conductive layer, a first organic dielectric layer positioned adjacent the first conductive layer, a second conductive layer, and a second organic dielectric layer positioned adjacent the second conductive layer. The first conductive layer defines a chip attach layer and the second conductive layer defines a board attach layer. A laminated capacitor structure is formed between the first and second dielectric layers and has a thickness of less than or equal to approximately 42 microns and a dielectric constant of greater than or equal to approximately 12. In one example, the thicknesses of each of the first and second conductive layers is approximately 12 microns, and the thickness of the dielectric layers is approximately 8 microns. A distance between an outer surface of the capacitor structure and an inner surface of the first conductive layer is less than or equal to approximately 100 microns.

In a further embodiment, the invention provides an interconnect module comprising a laminated capacitor structure, alternating conductive and dielectric layers laminated about opposite sides of the capacitor structure, and one or more vias extending through some or all of the conductive and dielectric layers, wherein the vias are plated or filled with a conductive material to define conductive paths between the laminated capacitor structure and outer conductive layers of the interconnect module, and wherein the contact pads, the conductive paths, and the capacitor structure produce a combined power and ground distribution impedance of less than or equal to approximately 0.60 ohms at a frequency of greater than or equal to approximately 1.0 gigahertz.

The invention is capable of providing a number of advantages. For example, the interconnect module can be made with an extremely thin capacitor structure having a very high dielectric constant. Consequently, the interconnect module is capable of providing reduced power distribution impedance at higher frequencies, thereby improving performance. In particular, with a reduced power and ground distribution impedance, an interconnect module in accordance with the invention permits faster switching time for external busses, thus increasing system bandwidth.

In addition, methods for making the interconnect module benefit from the use of a laminated capacitor structure, which may take the form of a dielectric coating formed between two copper foils. Thus, the conductive layers do not need to be plated, promoting ease of manufacturability. The laminated capacitor structure can be pre-constructed, patterned and pre-drilled before it is combined with the other layers, facilitating construction of the interconnect module and permitting the structure to be pre-tested for proper operation. In addition, the laminated capacitor structure can be pre-tested for acceptable electrical operation in advance of its use in an interconnect module.

The details of one or more embodiments of the invention are set forth in the accompanying drawings and the description below. Other features, objects, and advantages of the invention will be apparent from the description and drawings, and from the claims.

The term "conductive" as used herein means electrically conductive.

DETAILED DESCRIPTION

Figure 1:
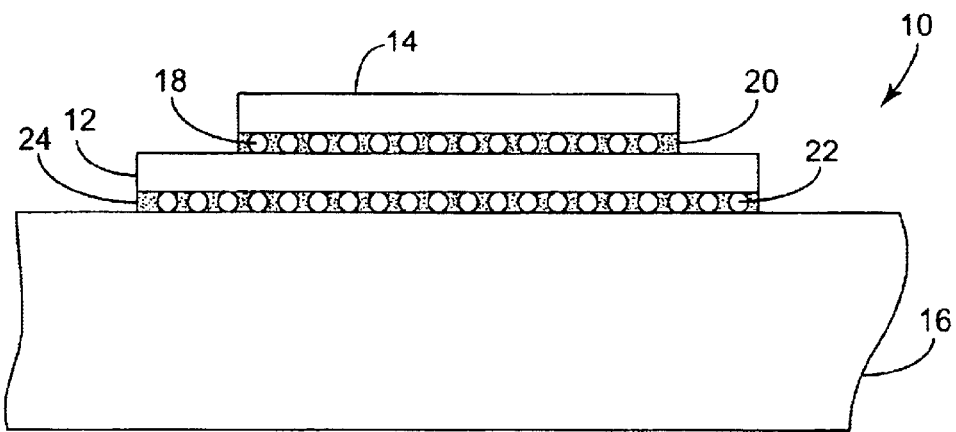
FIG. 1 is a cross-sectional side view illustrating an electronic package incorporating an interconnect module that attaches an integrated circuit chip to a printed wiring board.

FIG. 1 is a cross-sectional side view illustrating an electronic package 10 that incorporates an interconnect module 12. As will be described, interconnect module 12 exhibits low impedance power distribution characteristics that are especially useful for high frequency switching applications. In particular, interconnect module 12 is capable of providing a power distribution impedance of less than or equal to approximately 0.60 ohms at a frequency of greater than or equal to approximately 1.0 gigahertz. To achieve reduced power distribution impedance, interconnect module 12 incorporates an embedded capacitor structure that is extremely thin and makes use of very high dielectric constant material.

Figure 2:
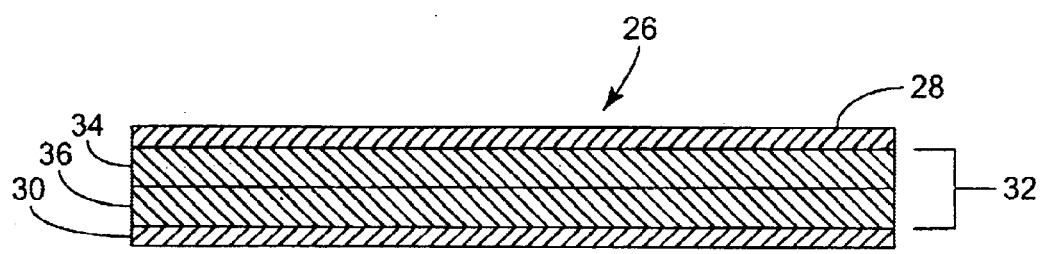
FIG. 2 is a cross-sectional side view illustrating a capacitor structure for use in an interconnect module.

As shown in FIG. 1, interconnect module 12 serves as an intermediate component that attaches an integrated circuit chip 14 to a printed wiring board (PWB) 16. As illustrated in FIG. 2, interconnect module 12 includes an alternating stack of conductive and dielectric layers that are laminated together to form a unitary structure. Vias formed in interconnect module 12 provide conductive paths that serve to route I/O's from chip 14 to corresponding I/O's on PWB 16, and distribute power and ground potentials between the PWB and the chip.

Chip 14 may be electrically and mechanically coupled to interconnect module 12 via an array of solder ball connections 18. The solder ball connections 18 are electrically coupled to contact pads on a lower surface of chip 14 and an upper surface of interconnect module 12. When interconnect module 12 and chip 14 are attached to one another, solder ball connections 18 are heated to undergo solder reflow and form electrically conductive bonds between opposing contact pads. An underfill adhesive 20 can be added to fill the voids between solder balls 18 and thereby reinforce the mechanical bond between interconnect module 12 and chip 14. The underfill adhesive 20 can be formed from an epoxy resin that solidifies when cured, thus reducing movement of chip 14 with respect to interconnect module 12. Consequently, the electrical connections formed by solder balls 18 are less likely to fail during use.

Interconnect module 12 is attached to PWB 16 with a similar arrangement. In particular, solder ball connections 22 serve to electrically and mechanically couple contact pads on interconnect module 12 to corresponding contact pads on PWB 16. The contact pads on PWB 16 may be electrically coupled to conductive traces or vias formed in various layers of the PWB. Again, an underfill adhesive 24 can be added to reinforce the mechanical bond between interconnect module 12 and PWB 16, if desired. To promote reliable bonds, interconnect module 12 preferably has a coefficient of thermal expansion (CTE) that approximates the CTE of PWB 16. In this manner, interconnect module 12 is capable of reliably attaching integrated circuit chip 14 to PWB 16. In addition, as described in detail below, interconnect module 12 makes use of an internal capacitor structure to achieve reduced power distribution impedance of less than or equal to approximately 0.60 ohms at high operating frequencies, including frequencies in excess of 1.0 gigahertz. In this manner, the interconnect module is effective in limiting simultaneous switching output (SSO) noise, core sag, and other forms of signal degradation at very high frequencies.

FIG. 2 is a cross-sectional side view illustrating a capacitor structure 26 for use in interconnect module 12. Capacitor structure 26 may include first conductive layer 28, second conductive layer 30, and a dielectric layer 32. Dielectric layer 32 may be formed by a single dielectric layer or first and second dielectric sublayers 34, 36, as shown in FIG. 2. In particular, dielectric layer may be formed by coating a dielectric material to at least one of first and second conductive layers 28, 30, and then applying heat and pressure to laminate capacitor structure 26 and cure the dielectric layer. In some cases, a dielectric layer 34, 36 can be coated to each of conductive layers 28, 30, respectively.

First and second conductive layers 28, 30 can be formed by copper foils, and serve as power and ground planes. Dielectric layer 32 may take the form of an epoxy resin loaded with high dielectric constant particles. The dielectric particles may be selected, for example, from the group consisting of barium titanate, barium strontium titanate, titanium oxide, and lead zirconium titanate. The loaded epoxy resin can be coated onto one or both of conductive layers 28, 30, e.g., by roll coating, and dried. Conductive layers 28, 30 may each have a thickness ranging from approximately 10 to 80 microns and, more preferably, 10 to 40 microns. In one embodiment, each conductive layer 28, 30 is approximately 18 microns in thickness.

As one example, the dielectric material can be coated onto both foils. After the coating dries, the coated sides of the foils can be joined together, and the resultant structure can be laminated using heat and pressure to cure the dielectric material. Capacitor structure 26 preferably is extremely thin and exhibits an extremely high dielectric constant. For example, the dielectric material in dielectric layer 32 preferably is formulated such that, upon curing, it has a total dry thickness of less than or equal to approximately 8 microns and, more preferably, approximately 1 to 4 microns. In addition, the dielectric material has a high dielectric constant of greater than or equal to approximately 12 and, more preferably, approximately 12 to 150.

The resulting laminated capacitor structure 26, comprises two foil layers, each having a thickness in the range of approximately 10 to 40 microns and a dielectric constant in the range of 12 to 150, and has a capacitance in the range of approximately 1.4 to 132 nanofarads per $cm^2$ and contributes to a significantly reduced power distribution impedance for chip 14. Specifically, the first contact pads, the conductive paths, and the first or second conductive layer produce a combined impedance that is less than or equal to approximately 0.60 ohms at a frequency of greater than or equal to approximately 1.0 gigahertz. In this manner, the incorporation of capacitor structure 26 promotes faster switching frequencies within chip 14.

Laminated capacitor structures suitable for use in interconnect module 12, as well as processes for manufacture of such structures, are described in copending and commonly assigned U.S. patent application Ser. No. 09/241,817, entitled PASSIVE ELECTRICAL ARTICLE, CIRCUIT ARTICLES THEREOF, AND CIRCUIT ARTICLES COMPRISING A PASSIVE ELECTRICAL ARTICLE, filed Feb. 1, 1999, and copending and commonly assigned U.S. patent application Ser. No. 09/902,302, entitled CAPACITOR HAVING EPOXY DIELECTRIC LAYER CURED WITH AMINOPHENYLFLUORENES, filed Jul. 10, 2001, as well as PCT publication WO 00/45634, entitled "PASSIVE ELECTRICAL ARTICLE, CIRCUIT ARTICLES THEREOF, AND CIRCUIT ARTICLES COMPRISING A PASSIVE ELECTRICAL ARTICLE," the entire content of each of which is incorporated herein by reference. For example, the above-referenced patent applications describe the preparation of a dielectric material that includes an epoxy loaded with barium titanate particles. The dielectric material may be coated onto copper foil substrates, which are then laminated together to form a capacitor structure.

Figure 3:
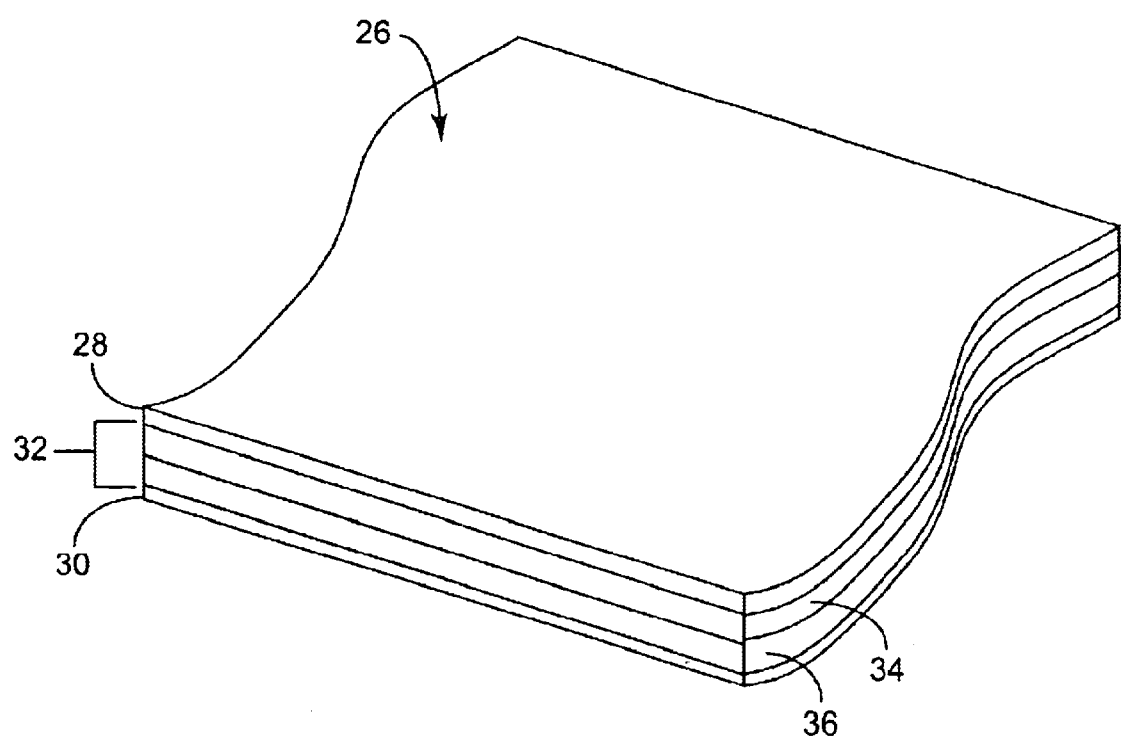
FIG. 3 is a perspective view illustrating the capacitor structure of FIG. 2.

FIG. 3 is a perspective view illustrating capacitor structure 26 of FIG. 2. As shown in FIG. 3, capacitor structure 26 can be made flexible, facilitating storage as a web on a roll prior to use in interconnect module 12. For use in interconnect module 12, capacitor structure 26 can be cut to size and pre-patterned or pre-drilled according to the design of the interconnect module. In particular, vias, traces, and other conductive paths can be formed in capacitor structure 26 before interconnect module 12 is fully assembled. Capacitor structure 26 can then be laminated with other layers within interconnect module 12 to form a package that attaches on one side to chip 14 and on the other side to PWB 16.

Capacitor structure 26 can be used in a variety of different interconnect modules. In addition, some interconnect modules may incorporate two or more capacitor structures 26. FIGS. 4–7 present a number of examples that illustrate this variety, but are not to be considered limiting of the invention as broadly embodied and claimed herein. For example, capacitor structure 26 can be used as a core for an interconnect module, with additional dielectric and conductive layers being built about the core. In another example, two capacitor structures 26 may be built about a metal or dielectric core, along with intervening dielectric and conductive layers. In each case, capacitor structure 26 contributes to a reduced power distribution impedance and promotes faster switching frequencies.

Figure 4:
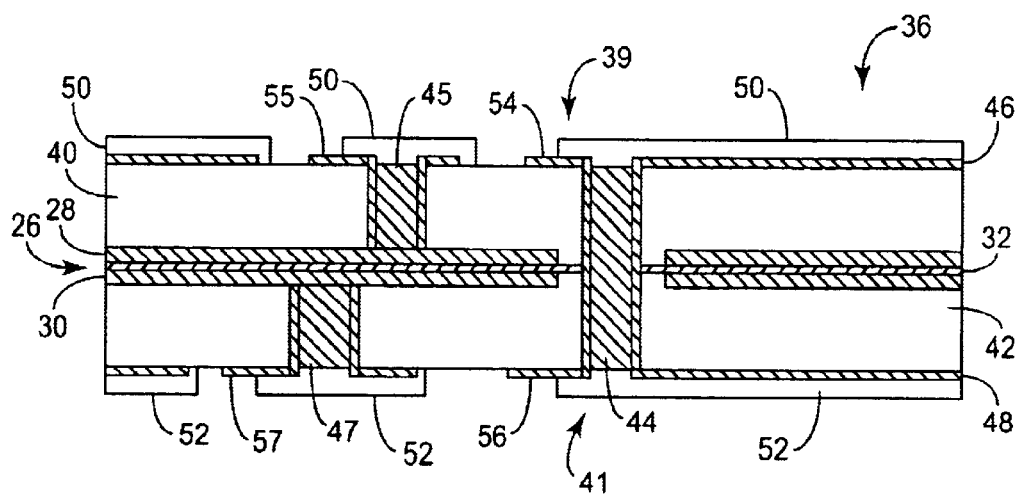
FIG. 4 is a cross-sectional side view illustrating a first embodiment of the interconnect module.

FIG. 4 is a cross-sectional side view illustrating a first interconnect module 36. Interconnect module 36 has a chip attach surface 39 and a board attach surface 41. In addition, interconnect module 36 includes capacitor structure 26 having first conductive layer 28, second conductive layer 30, and first dielectric layer 32. In the example of FIG. 4, capacitor structure 26 is formed in combination with second and third dielectric layers 40, 42 and third and fourth conductive layers 46, 48. The conductive and dielectric layers shown in FIG. 4 are disposed symmetrically about capacitor structure 26. That is, each dielectric or conductive layer formed on one side of capacitor structure 26 has a corresponding layer of the same material formed on the opposite side of the capacitor structure.

As further shown in FIG. 4, a first via 44 extends through dielectric layers 40, 42 from chip attach surface 39 to board attach surface 41. A second via 45 extends through dielectric layer 40 from chip attach surface 39, and terminates at first conductive layer 28 of capacitor structure 26. A third via 47 extends through dielectric layer 42 from board attach surface 41, and terminates at second conductive layer 30. Each via 44, 45, 47 is plated with conductive material using any of the deposition techniques that are well known in the microelectronic fabrication art. Alternatively, each via 44, 45, 47 is filled with an electrically conductive material to define a conductive path.

Capacitor structure 32 may be pre-drilled to provide a clearance hole for via 44. Vias 44, 45 can be plated with a conductive material at the surface of chip attach surface 39. Similarly, via 47 can be plated with a conductive material at the surface of board attach surface 41. Solder masks 50, 52 can be applied to chip attach surface 39 and board attach surface 41, respectively, to cover vias 44, 45, 47. Each solder mask 50, 52 exposes a contact pad adjacent each via 44, 45, 47. For example, solder mask 50 exposes contact pads 54, 55, whereas solder mask 52 exposes contact pads 56, 57. Solder balls associated with the chip can be aligned over contact pads, 54, 55, heated, and reflowed to form an electrical and mechanical bond with the contact pads. Likewise, solder balls associated with the board can be aligned over contact pads, 56, 57, heated, and reflowed to form a electrical and mechanical bond with the contact pads.

In the example of FIG. 4, capacitor structure 26 forms a core for interconnect module 36, with first and second conductive layers 28, 30 forming power and ground planes. Second dielectric layer 40 is formed between first conductive layer 28 and chip attach surface 39, and third conductive layer 46 is formed between second dielectric layer 40 and the chip attach surface. In particular, third conductive layer 46 can be patterned to form contact pads 54, 55. Similarly, third dielectric layer 42 is formed between second conductive layer 30 and the board attach surface 41, and fourth conductive layer 48 is formed between third dielectric layer 42 and the board attach surface. Like the third conductive layer 46, the fourth conductive layer 48 can be patterned to form contact pads 56, 57.

Third and fourth dielectric layers 40, 42 may be formed from laminates of high-temperature organic dielectric substrate materials, such as polyimides and polyimide laminates, epoxy resins, liquid crystal polymers, organic materials, or dielectric materials comprised at least in part of polytetrafluoroethylene, with or without a filler. In one embodiment, dielectric layers 40, 42 are made of an organic material such as polytetrafluoroethylene (PTFE), and more particularly, an expanded PTFE or "ePTFE" which is impregnated with cyanate ester and epoxy. The PTFE material may be, in particular, an expanded polytetrafluoroethylene matrix containing a mixed cyanate ester-epoxy adhesive and inorganic filler.

Conductive layers 46, 48 may be formed from a conductive material, such as copper. Other well-known conductive materials can also be used such as aluminum, gold, or silver. In this example, conductive layers 46, 48 may each have a thickness in the range of approximately 5 to 14 microns. In one example, the thickness of each conductive layer 46, 48 is approximately 12 microns. Dielectric layers 40, 42 may each have a thickness in the range of approximately 20 to 70 microns. In one example, the thickness of each dielectric 40, 42 layer is approximately 36 microns. Thus, the distance between an outer surface of first conductive layer 28 and an inner surface of contact pad 55 is less than 100 microns and, in the example of FIG. 4, less than or equal to approximately 36 microns.

The various layers of interconnect module 36 can be stacked together and laminated using heat and pressure. For example, all of the layers can be simultaneously laminated with another in a stack. Alternatively, the layers can be built upon capacitor structure 26 one at a time, and incrementally built with one or two additional layers added in each lamination step. During lamination, dielectric layers 40, 42 melt and flow into the clearance holes defined by capacitor structure 26 for via 44.

Via 44 forms a conductive path that interconnects contact pads 54, 56 on chip attach surface 39 and board attach surface 41. In this manner, via 44 is capable of interconnecting I/O's or other terminals associated with the chip to terminals on the PWB. Via 45 interconnects contact pad 55 with first conductive layer 28 of capacitor structure 26, which may form a power plane. Similarly, via 47 interconnects contact pad 57 with second conductive layer 30, which may form a ground plane. Alternatively, first and second conductive layers 28, 30 may form a ground plane and power plane, respectively.

Interconnect module 36 may include multiple vias similar to vias 44, 45, 47. Via 44 serves to interconnect contact pads on chip attach surface 39 and board attach surface 41, e.g., for I/O interconnection. Vias 45, 47 serve to distribute ground and power potentials from the board to the chip. In particular, interconnect module 36 may include additional vias that interconnect contact pads on board attach surface 41 with first conductive layer 28, e.g., to distribute a power or ground potential to the conductive layer from the PWB. Similarly, additional vias may interconnect second conductive layer to contact pads on chip attach surface 39 to distribute ground or power potentials to the chip.

Vias 44, 45, 57 can be formed following lamination of interconnect module 36. In particular, via 44 can be formed by drilling or laser ablation processes as described, for example, in U.S. Pat. No. 6,021,564, the entire content of which is incorporated herein by reference. Following lamination, solder masks 50, 52 are added to interconnect module 36 to cover vias 44, 45, 47. Solder masks 50, 52 are then patterned to define contact pads 54, 55, 56, 57 for receipt of solder balls from a chip and PWB, respectively.

In some embodiments, interconnect module 36 may accept a "flip-chip" integrated circuit. Flip-chip mounting entails placing solder balls on a die or chip, flipping the chip over, aligning the chip with the contact pads on a substrate, such as interconnect module 36, and reflowing the solder balls in a furnace to establish bonding between the chip and the substrate. In this manner, the contact pads are distributed over the entire chip surface rather than being confined to the periphery as in wire bonding and tape-automated bonding (TAB) techniques. As a result, the maximum number of I/O and power/ground terminals available can be increased, and signal and power/ground interconnections can be more efficiently routed on the chips.

Capacitor structure 26 significantly reduces the power distribution impedance within interconnect module 36. Assuming that first conductive layer 28 is a power plane and contact pad 55 is coupled to a solder ball that contacts the power input of a chip mounted on chip attach surface 36, the power distribution impedance observed by the chip is the combined impedance of contact pad 55, conductive via 45, and first conductive layer 28. The power distribution impedance includes not only capacitive, but inductive, components, and is dependent on frequency of operation. A technique for calculation of power distribution impedance is set forth later in this description.

Figure 5:
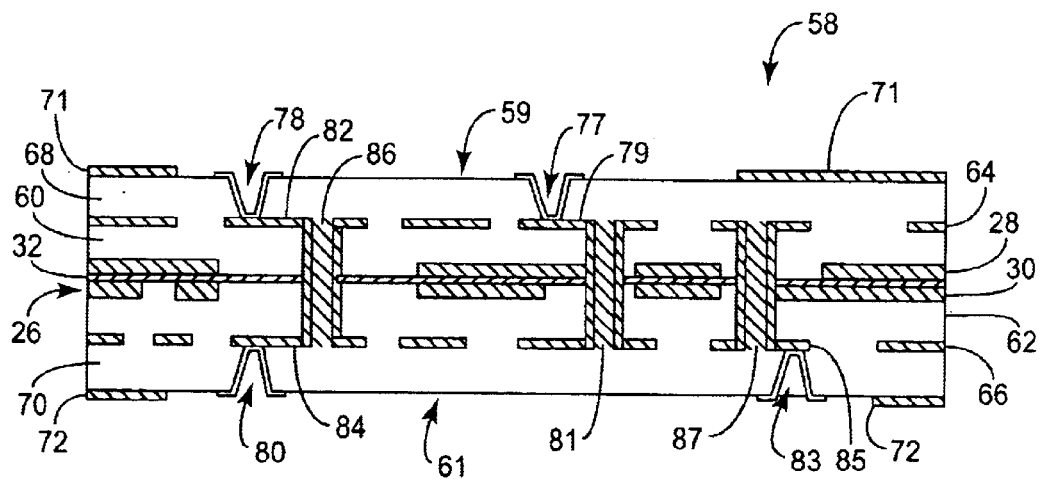
FIG. 5 is a cross-sectional side view illustrating a second embodiment of the interconnect module.

FIG. 5 is a cross-sectional side view illustrating a second interconnect module 58 with a chip attach surface 59 and a board attach surface 61. As shown in FIG. 5, interconnect module 58 includes a central capacitor structure 26 with first and second conductive layers 28, 30 and a first dielectric layer 32. In addition, interconnect module 58 includes second and third dielectric layers 60, 62 on opposite sides of central capacitor structure 26.

A third conductive layer 64 is formed between second dielectric layer 60 and chip attach surface 59. A fourth conductive layer 66 is formed between third dielectric layer 62 and board attach surface 61. First and second conductive layers 28, 30 may form power and ground planes, whereas third and fourth conductive layers 64, 66 may be patterned to form signal layers.

A fourth dielectric layer 68 is formed between third conductive layer 64 and chip attach surface 59, whereas a fifth dielectric layer 70 is formed between fourth conductive layer 66 and board attach surface 61. Finally, conductive layers 71, 72 can be formed on die attach surface 59 and board attach surface 61, respectively, and patterned to define preformed apertures for the formation of vias. Thus, the laser used to form the vias is applied to ablate only the dielectric material.

Conductive layers 64, 66, 71, 72 all may be formed from copper with a thickness in the range of approximately 5 to 14 microns and, more preferably, 12 microns. Each of dielectric layers 60, 62, 68, 70 may have a thickness in the range of approximately 20 to 70 microns and, more preferably, 36 microns. Thus, the distance between an outer surface of first conductive layer 28 and an inner surface of contact pad 71 is less than 100 microns and, more preferably, less than or equal to approximately 88 microns. The various layers can be laminated together or sequentially. After conductive layers 64, 66 are laminated to dielectric layers 60, 62, respectively, they can be patterned to define signal traces. Similarly, conductive layers 71, 72 can be patterned upon lamination to dielectric layers 68, 70, respectively.

In some embodiments, the conductive layers are "balanced" to promote structural uniformity and resist deformation due to thermal stresses. In particular, conductive layers symmetrically positioned on opposite sides of capacitor structure 26 may be reciprocally constructed so that each has the same type of metal foil laminated or plated thereon and etched into a pattern across it; the metal concentration in each layer is approximately equal. In this manner, the CTE of one layer and a CTE of the other layer are substantially equal, thereby balancing one another and minimizing warp of the interconnect module under thermal stress.

For I/O interconnection, interconnect module 58 includes a number of conductive vias, such as buried via 86, which extend through dielectric layers 60, 62 and contact electrodes 82, 84 at signal layers 64, 66. Electrodes 82, 84, in turn, contact blind vias 78, 80 at chip attach surface 59 and board attach surface 61. Typically, blind vias are formed through only one dielectric layer and are used for routing connections between two adjacent conductive layers. However, blind vias can be formed that extend through a plurality of laminated substrate layers in order to connect multi-conductive layers. The conductive layers can be patterned, and any necessary blind vias to connect adjacent conductive layers formed, before the remaining layers are bonded to the overall structure.

A blind via may have an entrance aperture of less than approximately 75 microns in diameter. The range of aspect ratios for the blind vias may be in the range of 1:1 to 5:1, inclusive. For example, a blind via may be formed having a via entrance width of 50 microns and extending through a dielectric layer having a thickness of 50 microns.

For power and ground distribution, interconnect module 58 also includes a number of conductive buried vias 81, 87 that contact either first conductive plane 28 or second conductive plane 30. Via 81 contacts an electrode 79 at signal layer 66 that, in turn, contacts a blind via 77 formed at chip attach surface 59. Via 87 contacts an electrode 85 at signal layer 64, which contacts a blind via 83 at board attach surface 61. Each buried via may have an aspect ratio of between approximately 3:1 and 25:1.

Blind vias 78, 77 receive solder balls from a chip attached to interconnect module 58. The solder balls are heated and reflowed to form conductive bonds with vias 78, 77, thereby interconnecting I/O's on the chip with I/O's on the interconnect module 58. Likewise, blind vias 80, 83 receive solder balls to provide electrical and mechanical connection of the interconnect module to the board. The solder balls are heated and reflowed to form conductive bonds with vias 80, 83, thereby interconnecting I/O's on the interconnect module with I/O's on the board.

The blind and buried vias present a low inductance signal path, further reducing impedance in interconnect module 58. As shown in FIG. 5, via 78 contacts conductive layer 64, which proceeds laterally to contact buried via 86. Buried via contacts conductive layer 66, which proceeds laterally to contact via 80. In this manner, portions of the conductive layers are routed along parallel but vertically spaced paths, with the current or signal flowing in opposite directions.

By arranging the signals in the above manner, a mutual inductance formed by a first signal path segment with a second adjacent signal path segment cancels a mutual inductance formed by the second conductive path segment with the first conductive path segment. This is due to the fact that current flowing through the vias flows in one direction in the first signal path segment and flows in an opposite direction in an adjacent signal path segment.

Again, in the example of FIG. 5, capacitor structure 26 is extremely thin and, at the same time, presents a high dielectric constant. As a result, capacitor structure 26 reduces power distribution impedance within interconnect module 58. When combined with the low inductance paths defined by blind and buried vias, capacitor structure 26 yields an interconnect module capable of operating at high frequencies above 1.0 gigahertz with a power distribution impedance of less than or equal to about 0.60 ohms.

Figure 6:
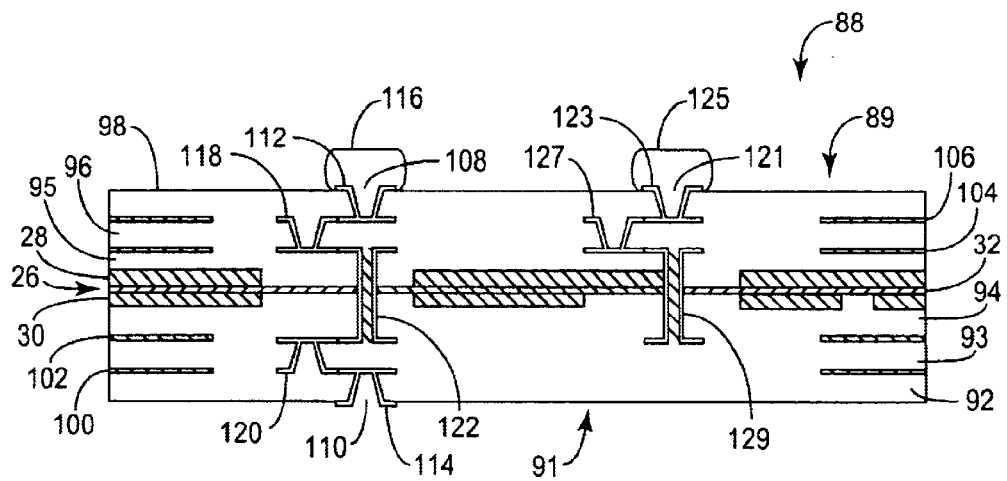
FIG. 6 is a cross-sectional side view illustrating a third embodiment of the interconnect module.

FIG. 6 is a cross-sectional side view illustrating a third interconnect module 88. As shown in FIG. 6, third interconnect module 88 includes a central capacitor structure 26. In addition to first and second conductive layers 28, 30 and first dielectric layer 32, interconnect module 88 includes a series of alternating dielectric layers 92, 93, 94, 95, 96, 98, as well as a series of alternating conductive layers 100, 102, 104, 106. Conductive layers 100, 102, 104, 106 may be patterned to form signal layers. Conductive layers 28, 30 form power and ground plane layers.

Each dielectric layer 92, 93, 94, 95, 96, 98 may have a thickness in the range of approximately 20 to 70 microns and, more preferably, approximately 35 microns. Thus, each dielectric layer 92, 93, 94, 95, 96, 98 may have substantially the same thickness and, preferably, the same thickness tolerance. In addition, each dielectric material 92, 93, 94, 95, 96, 98 can be formed from the same material. In some embodiments, however, some of the dielectric materials arranged outwardly from capacitor structure 26, e.g., layers 92, 98, may have a higher elastic modulus than the inner dielectric layers, e.g., 93, 94, 95, 96, so that the flexural modulus of the interconnect module laminated substrate is substantially maximized.

Each conductive layer 100, 102, 104, 106 may have a thickness in the range of approximately 5 to 14 microns and, more preferably, approximately 12 microns. Accordingly, the distance between an outer surface of first conductive layer 28 and an inner surface of contact pad 112 may be less than approximately 150 microns. In the example of FIG. 6, the distance is approximately 136 microns.

As shown in FIG. 6, I/O interconnections are achieved by a combination of blind and buried vias. In particular, a first blind via 108 is formed on chip attach surface 89, and a second blind via 110 is formed on board attach surface 91. First and second vias 108, 110 are plated to form electrodes 112, 114, respectively. Each via 108, 110 may receive a solder ball from a chip or board, respectively. Solder ball 116 is illustrated in FIG. 6. Blind via 108 contacts a third blind via 118 at signal layer 106. Blind via 110 contacts a fourth blind via 120 at signal layer 100. Blind via 118 contacts a buried via 122 at signal layer 104, whereas blind via 120 contact the same buried via at signal layer 102.

Power and ground plane interconnections also can be made using a combination of blind and buried vias. As further shown in FIG. 6, chip attach surface 89 includes a blind via 121. Blind via 121 is plated to form electrode 123, and receives a solder ball 125 associated with a chip. Blind via 121 is coupled to a second blind via 127 at signal layer 106. In turn, blind via 127 is coupled to a buried via 129 at signal layer 104. As in the example of FIG. 5, the arrangement of the blind and buried vias results in cancellation of mutual inductance in interconnect module 88, further reducing power distribution impedance.

Signal layer 104 contacts first conductive layer 28 of capacitor structure 26 to interconnect solder ball 125 and the first conductive layer, which may serve as either a power or ground plane layer. A similar set of blind and buried vias can be provided to access second conductive layer 30. In addition, such vias may extend from either chip attach surface 89 or board attach surface 91 to distribute power and ground potentials to and from the chip and PWB. As in the examples of FIGS. 4 and 5, incorporation of capacitor structure 26 in interconnect module 88 substantially reduces power distribution impedance and enables faster switching frequencies.

Figure 7:
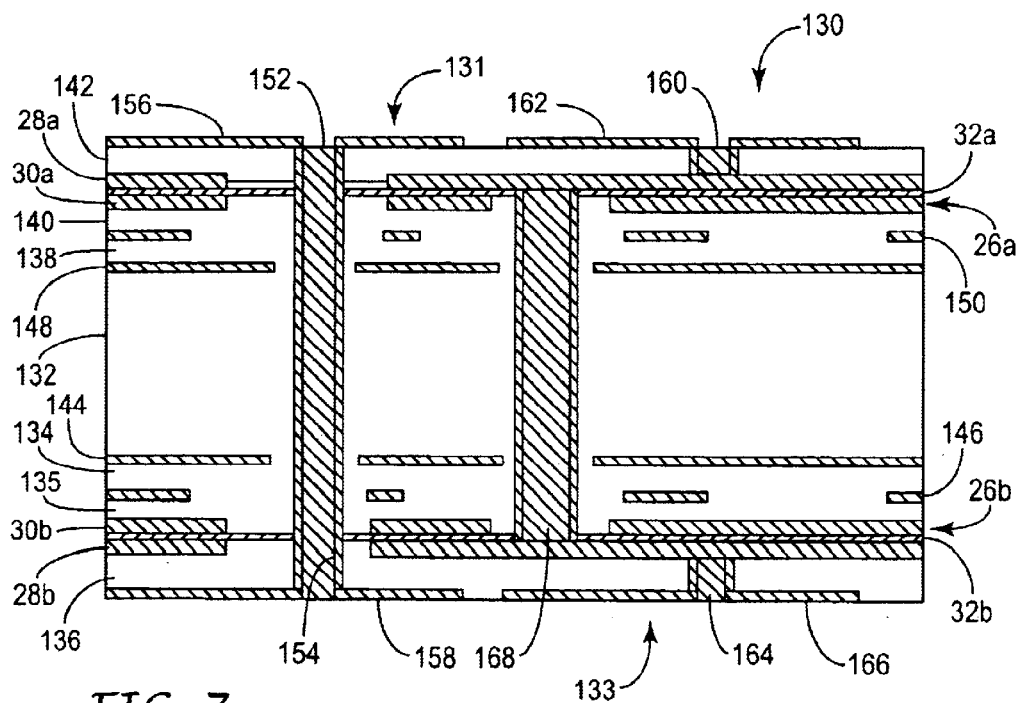
FIG. 7 is a cross-sectional side view illustrating a fourth embodiment of the interconnect module.

FIG. 7 is a cross-sectional side view illustrating a fourth interconnect module 130. In the example of FIG. 7, interconnect module 130 includes two capacitor structures 26a, 26b formed on opposite sides of a central dielectric core 132. Opposite sides of interconnect module 130 form a chip attach surface 131 and a board attach surface 133. Interconnect module 130 also includes an alternating arrangement of dielectric layers 134, 135, 136, 136, 140, 142 and conductive layers 144, 146, 148, 150. Conductive layers 144, 148 are formed on opposite sides of dielectric core 132 and may form power and ground planes. Conductive layers 146, 150 can be patterned to form signal trace layers, and are separate from conductive layers 144, 148 by dielectric layers 134, 138, respectively.

A dielectric layer 140 is formed between conductive layer 150 and capacitor structure 26a, whereas a dielectric layer 135 is formed between conductive layer 146 and capacitor structure 26b. Dielectric layers 136, 142 are positioned adjacent capacitor structures 26b and 26a, respectively. Multiple vias can be formed at chip attach surface 131 and board attach surface 133. In the example of FIG. 7, a via 152 filled with a conductive material 154 extends through interconnect assembly 130 and interconnects contact pads 156, 158 on chip attach surface 131 and board attach surface 133, respectively. Thus, via 152 may provide I/O interconnection between a chip and a PWB.

Via 160 extends from a contact pad 162 formed on chip attach surface 131 to contact first conductive layer 28a of capacitor structure 26a. Similarly, via 164 extends from a contact pad 166 formed on board attach layer 133 to contact first conductive layers 28b of capacitor structure 26b. A buried via 168 extends through interconnect module 136 to interconnect first conductive layers 28a, 28b of capacitor structures 26a, 26b. Thus, the combination of vias 160, 164 and 168 serves to distribute power or ground potentials between board attach surface 133 and chip attach surface 131.

In the example of FIG. 7, conductive layers 144, 146, 148, 150, 28a, 28b, 30a, and 30b can be assigned the following functions (in order from board attach surface 133 to chip attach surface 131):

Layer 28b: ground plane
Layer 30b: power plane
Layer 146: signal plane
Layer 144: ground plane
Layer 148: power plane
Layer 150: signal plane
Layer 30a: ground plane
Layer 28a: power plane Conductive layers 144, 146, 148, 150 can be formed from copper and have a thickness in the range of approximately 5 to 35 microns and, more preferably, 12 microns. Dielectric layers 134, 135, 136, 136, 140, 142 may be formed from a variety of materials such as polyimide, liquid crystal polymer, fluoropolymers, epoxy resins and the like, and have thicknesses in the range of approximately 10 to 50 microns and, more preferably, 20 microns. Dielectric core 132 may be formed from a variety of materials such as BT (bis-maleimide triazine) glass or FR4, and have a thickness in the range of 250 to 750 microns and, more preferably, 500 microns. Conductive layers 144, 146, 148, 150 can be patterned after they are applied to respective dielectric layers 134, 135, 136, 140 to define signal traces or separate power and ground planes. The distance between an outer surface of first conductive layer 28a and an inner surface of contact pad 156 may be less than approximately 50 microns. In the example of FIG. 7, the distance is approximately 20 microns.

Conductive layers 28a, 28b, 30a, 30b can be pre-patterned or pre-drilled prior to lamination with the other layers of interconnect module 130. Capacitor structures 26a, 26b of FIG. 7 may be constructed substantially as described in the examples of FIGS. 4–6, and thereby promote reduced power distribution impedance in interconnect module 130. In general, one or more very thin, high dielectric constant laminates such as capacitor structure 26 replace the center copper plane, or "core," typically used in existing interconnect modules. The high dielectric constant and thin profile of capacitor structure 26 produces a very high capacitance that reduces impedance. In addition, the thin profile of capacitor structure 26 in combination with reductions in the thickness of the interconnect module from the capacitor structure to the contact pads on the chip attach surface further reduces impedance.

Reducing the number of layers between capacitor structure 26 and the contact pads and the use of thin dielectric layers less than approximately 40 microns in thickness achieves reduced thickness. As mentioned above, manufacture of capacitor structure 26, in many applications, can be readily accomplished by first patterning the capacitor structure laminate to form clearances for vias where desired, and then constructing the package substrate outward from the capacitor structure laminate by adding additional layers, e.g., as described in U.S. Pat. Nos. 5,879,787 or 6,021,564, the entire content of each being incorporated herein by reference.

The increased dielectric constant and reduced thickness of capacitor structure 26 provide an increased capacitance that is a major factor in reducing power distribution impedance. The impact of capacitor area, dielectric thickness and dielectric constant are represented in the following equation:

$$C = \frac{\varepsilon_0 * \varepsilon * A}{t}$$

where C is capacitance, $\varepsilon_0$ is the permittivity of free space, $\varepsilon$ is the relative dielectric constant, A is the area of the capacitor, and t is the thickness or distance between the parallel capacitor plates. Thus, in the case of an interconnect module, C is the capacitance formed by a pair of parallel conductive layers or planes.

The capacitance can be increased by increasing the area, decreasing the dielectric thickness, increasing the dielectric constant, or any combination of the above. For the case of on-chip capacitors, unfortunately, increasing the area leads to a larger die, decreasing thickness leads to increased defect density, and increasing the dielectric constant increases on-chip signal propagation delay.

Therefore, according the invention, the necessary capacitance is provided by a laminated capacitor structure 26 embedded within the interconnect module. In general, it is desirable that the capacitor structure be placed physically as close to the chip attach surface as possible in an effort to minimize the series inductance to connect to the planes, while at the same time maximizing the capacitance of the capacitor structure plane pair. In addition, it is desirable that only as few circuitry layers as are necessary be formed between the plane pair and the chip connection, and that dielectric and conductive layer thicknesses be minimized.

Interconnect modules constructed according to the examples of FIGS. 4–7 may further include structure designed to promote bonding reliability and resists deformation in the presence of thermal stresses. In particular, each interconnect module is made of the alternating laminates of conductive layers and dielectric layers, described above, that are selected to present on overall coefficient of thermal expansion (CTE) that nearly matches the CTE of the PWB.

Additionally, as described in U.S. Pat. No. 5,983,974, the entire content of which is incorporated herein by reference, a stiffener ring may be adhered to the die attach surface of the interconnect device. The stiffener ring defines a cavity (or cavities) for the integrated circuit chip and any other devices, such as capacitors, that are attached on the same surface to the interconnect module.

A lid may be bonded to the stiffener ring to enclose the chip within the interconnect module package. The lid may be made of material such as copper or may include a preform made from a metallic material, such as aluminum, disposed in which is a reinforcement material, such as silicon carbide. In this case, package is designed so that the CTE of the stiffening ring matches the CTE of the interconnect module and the lid. Further, the particular adhesives used to bond the stiffening ring are chosen to match their CTE to that of the substrate, ring and lid. Moreover, the substrate can be designed so that its CTE, at least in-part, matches that of the chip, and also that of the stiffening ring as described in U.S. Pat. No. 6,248,959, the entire content of which is incorporated herein by reference.

A technique for quantifying a power distribution impedance figure of merit will now be described. The figure of merit can be used to classify the impedance characteristics of an interconnect module incorporating an extremely thin, high dielectric constant laminated capacitor structure, as described herein, in comparison to other interconnect modules. Other techniques for quantifying power distribution impedance may occur to those skilled in the art. Accordingly, the technique described herein is not to be considered limiting of the invention.

For any high performance multi-layer package cross-section, there are a number of conductive planes dedicated to either power or ground. For purposes of the test described herein, all of the power planes are assigned to one voltage and all the ground planes to another, with the intent of calculating the frequency dependent input impedance. Although an interconnect module may not be implemented in this manner, due to multiple voltage requirements, this assumption simplifies analysis of the power distribution impedance.

The measurement problem can be divided into two components: ground impedance and power impedance. The power and ground impedances typically will be different due to the physical configuration of interconnect module 36. For example, the power and ground planes, e.g., first and second conductive layers 28, 30, typically will be positioned at different levels within interconnect module 36 and, as a result, at different distances from contact pads on chip attach surface 39.

First, it is assumed that the frequency is high enough that the power and ground planes can be treated as transmission lines. This should be a good approximation for operating frequencies in excess of 200 megahertz. Accordingly, transverse electromagnetic (TEM) propagation can be assumed, which allows the characteristic impedance for the planes to be estimated based on the dielectric constant of the material in dielectric layer 32, the associated spacing to the surrounding conductive layers 28, 30, the frequency, and the area of interest. The calculation can be performed according to the following procedure:

1. Estimate the intrinsic TEM propagation delay Td as follows:

$$Td=\sqrt{\epsilon r}/c,$$

where ∈r is relative dielectric constant and c is the speed of light.

2. Calculate the transmission line quarter wavelength:

$$l=0.25/(f*Td),$$

where l is length, and f is the frequency of analysis.

3. Calculate the applicable package area:

If l>Body_Size/2

$$A=(Body\_size)^2$$

Else $$A=\pi*l^2,$$

where Body_Size represents the outline of the package.

4. Calculate the capacitance to adjacent planes:
   a. First adjacent plane $$C_1=\epsilon_r*\epsilon_0*A/Plane\_separation_1,$$

where Plane_separation$_1$ represents the distance between a first conductive layer and the chip.

b. Second adjacent plane, if present $$C_2=\epsilon_r*\epsilon_0*A/Plane\_separation_2$$

where Plane_separation$_2$ represents the distance between a second conductive layer and the chip.

c. Total capacitance $$C=C_1+C_2$$

5. Calculate the impedance of the plane $$Z=l*Td/C,$$

wherein Z is the total impedance, C is the total capacitance produced by all planes between the chip and the power or ground plane, and Td is the TEM propagation delay, and l is the length calculated above.

Given the calculations above, the inductance (L) can next be calculated from the chip die to the connection with the first power or ground plane, by using the equation below:

$$l_{via} = \frac{1}{2} * L_{wire\_pair} \approx \frac{t}{2} * \frac{\mu_0 \mu_r}{\pi} * \cosh^{-1}\frac{d}{2a}$$

where:
d=via pair pitch,
a=via radius,
t=length of via,
$\mu_0$=permeability of free space, and
$\mu_r$=relative permeability, typically 1.0.

This calculation of inductance is repeated for each subsequent power or ground plane layer until a connection is made between the chip die and the bottom-most ground plane.

Repeating the power/ground impedance model calculation is a matter of joining the transmission lines and the inductors, both as calculated above, into a network. To solve the network, the transmission lines are treated as frequency-independent resistors terminated in ground. Standard circuit analysis techniques then can be used to solve for the input impedance. The input impedance calculation is repeated for both the power and ground networks. Then, the figure of merit can be defined as the average of the power impedance and the ground impedance.

Set forth in Table 1 below are figures of merit for power distribution impedance for a number of different interconnect module constructions, including interconnect modules incorporating a thin, high dielectric constant capacitor structure as described herein and other interconnect modules without such a capacitor structure. Table 1 indicates the impedance figure of merit over a range of operating frequencies from 500 megahertz to 5 gigahertz.

TABLE 1

| INTERCONNECT | | IMPEDANCE (OHMS) vs. FREQUENCY (GHz) | | | | | |
|---|---|---|---|---|---|---|---|
| Type | Cross-section | 0.5 GHz | 1 GHz | 2 GHz | 3 GHz | 4 GHz | 5 GHz |
| 7-Layer (58 μm) | Gspgpsg | 0.42 | 0.67 | 1.13 | 1.75 | 2.51 | 3.33 |
| 7-Layer VIP (36 μm) | Gspgpsg | 0.31 | 0.51 | 0.88 | 1.36 | 1.93 | 2.53 |
| *8-Layer HiDk (58 μm) | gsp[gp]gsp | 0.35 | 0.62 | 1.10 | 1.69 | 2.35 | 3.08 |
| *8-Layer HiDk (36 μm) | gsp[gp]gsp | 0.27 | 0.48 | 0.86 | 1.32 | 1.85 | 2.39 |
| *8-Layer HiDk/VIP (36 μm) | Xgsp[gp]gspX | 0.25 | 0.46 | 0.81 | 1.25 | 1.75 | 2.26 |
| *2-4-2 Buildup HiDk | ps[gpIgp]sg | 0.14 | 0.26 | 0.48 | 0.74 | 1.01 | 1.30 |
| 4-2-4 Buildup | Pgspgspg | 0.16 | 0.26 | 0.43 | 0.67 | 0.95 | 1.26 |
| 5-Layer (58 μm) | Psgsp | 0.62 | 0.85 | 1.27 | 2.00 | 2.99 | 4.13 |
| 5-Layer VIP (36 μm) | Psgsp | 0.44 | 0.62 | 0.97 | 1.51 | 2.23 | 3.03 |
| *6-Layer HiDk (58 μm) | ps[gp]sg | 0.29 | 0.53 | 0.99 | 1.51 | 2.08 | 2.66 |
| *6-Layer HiDk (36 μm) | ps[gp]sg | 0.23 | 0.43 | 0.80 | 1.21 | 1.67 | 2.13 |
| *6-Layer HiDk/VIP (36 μm) | Xps[gp]sgX | 0.22 | 0.40 | 0.75 | 1.14 | 1.56 | 2.00 |
| *4-Layer HiDk (58 μm) | s[gp]s | 0.23 | 0.44 | 0.87 | 1.30 | 1.75 | 2.20 |
| *4-Layer HiDk (36 μm) | s[gp]s | 0.19 | 0.36 | 0.74 | 1.12 | 1.50 | 1.88 |
| *4-Layer HiDk/VIP (36 μm) | Xs[gp]sX | 0.18 | 0.35 | 0.69 | 1.04 | 1.40 | 1.76 |
| Thin Film on Ceramic Substrate | X[gp] | 0.05 | 0.10 | 0.20 | 0.30 | 0.41 | 0.52 |

In Table 1, the "Type" column refers to the type of interconnect module construction tested. In the Type column, the designation "X-layer," e.g., "7-layer" refers to the number of alternating conductive layers in the interconnect module. The designation "VIP" refers to a "via-in-pad"

construction in which the interconnect module includes in the number of conductive layers those layers made up on contact pads associated with vias in the chip attach and board attach surfaces.

The designation "HiDk" refers to a construction that incorporates a thin, high dielectric constant capacitor structure in accordance with the invention. Some constructions are both VIP and HiDk constructions. The "Buildup" designation refers to a construction in which layers are built about a 500 micron dielectric. In one case, designated 2-4-2 Buildup HiDk, an HiDk capacitor structure is added to a conventional buildup core. Each HiDk construction includes a "y-x-y" designation, where the x indicates how many conductive layers form the HiDk capacitor structure core, and the y indicates how many additional conductive layers are formed on either side of the HiDk core.

Any thicknesses in parentheses indicate the thicknesses of the intervening dielectric layers that separate the conductive layers in the pertinent interconnect module. In Table 1, all of the conductive layers are 12 micron copper. Given the qualifications above, the "5-layer (58 micron)" designation in the Type column indicates that the interconnect module under consideration has five conductive layers separated by 58-micron dielectric layers.

The "Cross-section" column in Table 1 indicates the arrangement of ground, power, signal, and contact pad layers in the interconnect module. The designation "s" indicates a signal layer, "g" indicates a ground plane layer, "p" indicates a power plane layer, X indicates a via-in-pad (VIP) layer, and [gp] indicates a power-ground plane pair formed by a HiDk capacitor structure.

In Table 1, each "HiDk" module constructed according to the invention is further identified with an asterisk (*). As is apparent from Table 1, with the exception of the 8-layer HiDk (58 micron) construction, the HiDk construction universally produces a power distribution impedance that is less than or equal to approximately 0.60 ohms for operating frequencies that are greater than or equal to approximately 1.0 gigahertz.

Given the figure of merit calculation outlined above, the 8-layer HiDk (36 micron) construction, for example, produces a power distribution impedance of approximately 0.48 ohms at 1.0 gigahertz. Similarly, the 8-layer HiDk/VIP construction produces an impedance of 0.46 ohms at 1.0 gigahertz. Even the 6-layer HiDk (58 micron) construction produces an impedance of 0.53 ohms at 1.0 gigahertz. Notably, as the number of layers decreases, the impedance becomes quite low. In the case of a 4-layer HiDk VIP construction, for example, the impedance is 0.35 ohms at 1.0 gigahertz. The 2-4-2 Buildup HiDk construction produces, for example, an impedance of 0.26 ohms at 1.0 gigahertz. In each case, the lower impedance promotes higher speed switching.

The last row of Table 1 represents an embodiment in which a thin film is formed on a ceramic substrate and combined with a capacitor structure as described herein to realize an interconnect module with reduced power distribution impedance.

EXAMPLE 1

Basic methods suitable for manufacturing interconnect modules with cross sections as described herein are disclosed in U.S. Pat. Nos. 5,879,787 and 6,021,564, as mentioned above. The following example describes a representative method for additionally producing a patterned high dielectric constant laminate, i.e., a capacitor structure as described with reference to FIGS. 1–7 above, for incorporation in an interconnect module to achieve reduced power distribution impedance. This example involves the use of a laminated capacitor structure comprising approximately 18 micron copper foil on either side of a high dielectric constant material that is approximately 8 microns in thickness.

First, the capacitor structure is formed. Copper foil substrates available from Carl Schenk A G, Nurenberg, Germany, are provided having a thickness of 18 microns, an anneal temperature of 140° centigrade and an average surface roughness (RMS) of 8 nm. Chemisorbed materials are removed in an oxygen/argon plasma using a device available from Plasma Science, Foster City, Calif., with a residence time of about six minutes. Particular debris is removed with a vacuum/ultrasonic web cleaner commercially available from Web Systems, Inc. of Boulder, Colo., under the trade designation "Ultracleaner."

Next, 6.4 grams of an epoxy commercially available from Shell Chemical Company, of Houston, Tex., under the trade designation Epon® 1001F and 1.6 grams of an epoxy commercially available from Shell Chemical Company under the trade designation Epon® 1050 were dissolved in 18 g of methyl ethyl ketone (MEK) and 35 g of methyl isobutyl ketone (MBK), both of which are commercially available from Aldrich Chemical, Milwaukee, Wis. 0.8 g of dispersant, a copolymer of polyester and polyamine, commercially available from ICI America, Wilmington, Del., under the trade designation "Hypermeer PS3" was added to the mixture.

47 g of barium titanate particles having an average particle size of 0.2 microns, commercially available from Cabot Performance Materials, Boyertown, Pa., under the trade designation, "BT-8," which had been heated in air at 350 degrees centigrade for 15 hours, were added slowly using a Ross laboratory mixer/emulsifier commercially available from Charles Ross & Sons, Hauppauge, N.Y., with a rotor/stator head running at 2000 revolutions per minute (rpm). Once all of the barium titanate was added, the speed was increased to 6000 rpm and the barium titanate was dispersed for twenty minutes in a container cooled in an ice bath to prevent heating the blend. The resulting blend was 55% solids by weight; the volume ratio of barium titanate to epoxy was 55:45.

The blend was allowed to sit undisturbed overnight to allow poorly dispersed agglomerates to settle. The blend was then filtered through a 2 micron stainless steel mesh filter to form a first blend. The weight percent solids of the first blend was measured at 53% and the volume percent loading of barium titanate in the first blend was measured at 53%; both measurements were made gravimetrically.

Then, 8.4 g of a 70% by weight solution of Epon® 1001 F in MEK, 1.8 g of an 80% by weight solution of Epon® 1050 in MEK, and 5.4 g of a 5% by weight solution of 2,4,6-tris(dimethylaminomethyl)phenol were filtered through a 0.45 micron filter and then added to 236 g of the first blend to form the second blend. The blend was made homogeneous by stirring or letting the container roller on a ball mill (without balls). Final solids content of the second blend was 43% by weight. The second blend was deaerated using an ultrasonic bath for five minutes.

The second blend was separately coated with a microgravure coater (in a cleanroom) onto two copper foils using a web speed of 25 feet/minute (12.7 cm/sec) and a gravure roll speed of 40 feet/minute (20 cm/sec). Gravure rolls were chosen to give a dry coating thickness of from 1 to 1.5 microns. The coating was dried at 95 degrees centigrade and then wound onto a core to form a roll.

The two blend-coated copper foils were then laminated together, in a cleanroom, coating side to coating side using a laminator commercially available from Western Magnum, El Segundo, Calif., with 150° centigrade rollers at 15 inches/minute (0.64 cm/sec) speed, and an air pressure to the rollers at 20 psi (140 kPa). The laminate was cured in air at 180 degrees centigrade for eighty minutes.

The cured laminate was tested using the 90 degree peel test described in the IPC Test Method Manual, IPC-TM-650, test number 2.4.9 dated October 1988, published by the Institute for Interconnecting and Packaging Electronic Circuits. A force of 3.4 pounds/inch (600 N/m) was required to separate the copper foils. The cured laminate was also tested for capacitance by the following test method: A 2 cm by 2 cm electrode was etched onto one side of the laminate using standard photolithographic and copper etching procedures and the capacitance was measured at 1 kilohertz using an LCR meter available from Hewlett Packard, Palo Alto, Calif., having model number 4261A. The measured capacitance was 6 $nF/cm^2$ with a dissipation factor of 0.004.

Next, a sheet of the resulting capacitor laminate was cut to size according to the dimensions of the interconnect module. An exemplary size is 33 millimeters by 33 millimeters. The laminate was trimmed and tooling holes were formed in the laminate using a punch. Fiducials for photolithography alignment, which may be through holes of approximately 300 microns in diameter, were then lased into the punched laminate sheet using the tooling holes as the alignment points.

Each of the two copper foils in the laminate was then coated with type 7025 15.75 inch wide photoresist. After trimming the excess photoresist from the edges of the laminate, the photoresist-coated tooling holes were pierced. Then, the Proform® 7700 printer with auto alignment was used to image the photoresist on both foils at standard exposure energy. The photoresist was then developed using a sodium carbonate solution and standard settings. Then, the clearances in the copper foils were etched with cupric chloride solution and standard settings. The photoresist was stripped with potassium hydroxide using standard settings, except that the stripper pressure should be lowered to 20 psi and less aggressive drying may be advisable to avoid damage to any of the exposed dielectric layer.

The exposed copper surfaces of the laminate were treated to increase adhesion in the subsequent, sequential lamination steps. Example treatments for promoting surface adhesion include brown or black oxide, Co-Bra® Bond treatment, or application of an adhesion promoter such as aminopropyl silane.

After formation, the capacitor laminate was processed within an interconnect module package as if it were a patterned copper sheet. In particular, the capacitor laminate was added within the center of other copper and dielectric layers in an alternating stack, and placed in a press that applied a laminate force. The copper layers were placed adjacent to layers, which were in a b-stage when pressed to facilitate the lamination process, yielding a unitary, multi-layered structure having a HiDk capacitor structure core with outer dielectric and conductive layers. Multiple laminations may be used in order to incorporate higher circuit layer counts or various blind and buried via structures.

During lamination, dielectric material from the adjacent layers flowed into and filled the openings between the patterned conductive layers. The dielectric layers were made of an organic PTFE-based material. Blind and buried vias were formed in the interconnect module structure by drilling at different stages of assembly to provide interconnections between contact pads and power and ground planes. The vias were drilled using a laser drilling technique. In particular, a Nd:YAG pulsed laser was used at either the third or fourth harmonic to produce an ultraviolet beam at either 266 nm or 355 nm, as described in U.S. Pat. No. 5,879,787.

To interconnect conductive layers, the blind and buried vias were plated in stages with a conductive material using known plating techniques such as electroless plating followed by electrolytic plating to define conductive paths through the laminate. Following plating, the outer conductive layers were patterned using standard photolithographic techniques to form the contact pads. The contact pads were used to make I/O connections and power/ground plane connections. Upon assembly of the interconnect module, including the laminated HiDk capacitor structure, a chip was added to the chip attach surface by reflowing an array of solder balls on the chip to bond them to corresponding contact pads on the chip attach surface, and the resultant structure then placed over a PWB for solder ball connection.

EXAMPLE 2

In another example, capacitor structure was formed with a dispersion as described in above-referenced U.S. application Ser. No. 09/902,302. In particular, a dispersion as indicated below in Table 2 was coated onto a copper foil using a gravure or die coating technique.

TABLE 2

| Component | Grams |
|---|---|
| Epon ® 1001F epoxy + Epon ® 1050 epoxy | 16.0 |
| 9,9-bis(3-chloro-4-aminophenyl) fluorine | 4.0 |
| Barium Titanate, 0.2 micron (Cabot Performance Materials) | 78.7 |
| PS3 polyester/polyamine copolymer dispersant (Uniquema) | 1.3 |
| 5-aminobenzotriazole | 0.08 |

Dry thicknesses of the dielectric ranged from approximately 2.0 to 5.0 microns. The coating was dried to a tack-free surface, and then wound into rolls. Two rolls were laminated, coated side by side, using two heated nip rollers. A standard photoresist laminator was used. The laminated material was cured at 180 degrees centigrade for 1.5 to 2.5 hours. The cured panels were patterned on one or both sides using conventional photoresist and etchant to produce individual capacitor structures.

EXAMPLE 3

As another example of the fabrication of a capacitor structure suitable for use in an interconnect module, a dispersion as described in above-referenced U.S. application Ser. No. 09/902,302 and Table 3 below was coated onto a copper foil.

TABLE 3

| Component | Grams[a] | Grams[b] |
|---|---|---|
| Epon ® 1001F epoxy | 20.2 | 16.2 |
| Epon ® 1050 epoxy | 5.0 | 4.0 |
| 9,9-bis(3-chloro-4-aminophenyl) fluorine | 0 | 5.1 |
| Barium Titanate, 0.2 micron (Cabot Performance Materials) | 100 | 100 |
| PS3 polyester/polyamine copolymer dispersant (Uniquema) | 1.8 | 1.8 |
| Methyl ethyl ketone/methyl isobutyl ketone (4:6) | 127 | 127 |
| 2,4,6-tris(dimethylaminomethyl)phenol | 0.25 | 0.025 or 0 |

[a]Standard formulation using only 2,4,6-tris(dimethylaminomethyl)phenol catalyst as the curing agent
[b]9,9-bis(3-methyl-4-aminophenyl)fluorene was also used.

The above dispersions were coated using a gravure or die coating technique. Adhesion promoting agents may be coated onto the substrate prior to coating by the epoxy. Typically, a dilute solution, e.g., 0.05 to 0.15% by weight in an alcohol such as methanol, is applied by standard coating techniques and the substrate dried. Dry thicknesses of the dielectric ranged from approximately 2.0 to 5.0 microns. The coating was dried to a tack-free surface, and then wound into rolls. Two rolls were subsequently laminated, coated side by side, using two heated nip rollers in a standard photoresist laminator. The laminated material was cured at 180 degrees centigrade for approximately two hours. The cured panels were then patterned on one or both sides using conventional photoresist and etchant to produce individual capacitors.

EXAMPLE 4

In another example, another dispersion as described in above-referenced U.S. application Ser. No. 09/902,302 and Table 3 below was coated onto a copper foil.

TABLE 4

| Component | Grams[a] | Grams[b] |
|---|---|---|
| Epon ® 1001F + Epon ® 1050 epoxy | 16.0 | 16.8 |
| 9,9-bis(3-chloro-4-aminophenyl) fluorine | 4.0 | 3.2 |
| Amine equivalent/epoxy equivalent ratio | 1:1 | 0.6:1 |
| Barium Titanate, 0.2 micron (Cabot Performance Materials) | 78.7 | 78.7 |
| PS3 polyester/polyamine copolymer dispersant (Uniquema) | 1.8 | 1.8 |
| 5-aminobenzotriazole catalyst | 0.08 | 0 |
| Initial Cure Temperature (degrees C.) | 180 | 225 |
| Adhesion after initial cure (pounds per inch) | 4.4 | 3.4 |
| Adhesion after six hours at 225 degrees C. (pounds per inch) | 2.0 | 4.0 |

This example compares two capacitor structures with the same raw materials, but with changes in the ratio of fluorene compound to epoxy, presence of a catalyst, and the initial cure temperature. The above dispersions were coated and laminated as in Examples 2 and 3 above. Dry thicknesses of the dielectric ranged from approximately 2.0 to 5.0 microns.

Various embodiments of the invention have been described. These and other embodiments are within the scope of the following claims. For example, the embodiments of the invention described herein may be used in combination with any of the additional structure or processes described in the following U.S. patents, the entire content of each of which is incorporated herein by reference: U.S. Pat. No. 5,888,630, U.S. Pat. No. 6,018,196, U.S. Pat. No. 5,983,974, U.S. Pat. No. 5,836,063, U.S. Pat. No. 5,731,047, U.S. Pat. No. 5,841,075, U.S. Pat. No. 5,868,950, U.S. Pat. No. 5,888,631, U.S. Pat. No. 5,900,312, U.S. Pat. No. 6,011,697, U.S. Pat. No. 6,021,564, U.S. Pat. No. 6,103,992, U.S. Pat. No. 6,127,250, U.S. Pat. No. 6,143,401, U.S. Pat. No. 6,183,592, U.S. Pat. No. 6,203,891, and U.S. Pat. No. 6,248,959.

What is claimed is:

1. An interconnect module comprising:
    a chip attach surface defining first contact pads for attachment to an integrated circuit chip;
    a board attach surface defining second contact pads for attachment to a printed wiring board;
    a capacitor structure having a first conductive layer, a second conductive layer, and a first dielectric layer formed between the first and second conductive layers, wherein the first conductive layer, the second conductive layer, and the first dielectric layer are laminated together; and
    conductive paths, formed in the interconnect module, that interconnect a plurality of the first contact pads to the first conductive layer,
    wherein the first contact pads, the conductive paths, and the capacitor structure produce a combined impedance of less than or equal to approximately 0.60 ohms at a frequency of greater than or equal to approximately 1.0 gigahertz.

2. The interconnect module of claim 1, further comprising additional conductive layers and additional dielectric layers:
    a second dielectric layer formed between the first conductive layer and the chip attach surface;
    a third conductive layer formed between the second dielectric layer and the chip attach surface;
    a third dielectric layer formed between the second conductive layer and the board attach surface; and
    a fourth conductive layer formed between the third dielectric layer and the board attach surface.

3. The interconnect module of claim 2, wherein said additional dielectric layers are formed from an expanded polytetrafluoroethylene matrix containing a mixed cyanate ester-epoxy adhesive and inorganic filler, and the layers of the interconnect module are laminated together to form a laminated package.

4. The interconnect module of claim 1, wherein the conductive paths are coupled to vias that interconnect a plurality of the first contact pads with a corresponding plurality of the first and second conductive layers to distribute power from the first conductive layer and a ground potential from the second conductive layer.

5. The interconnect module of claim 1, wherein the first and second conductive layers are copper foils, and the first dielectric layer is a coating of dielectric material formed on at least one of the copper foils.

6. The interconnect module of claim 5, wherein the dielectric material comprises an epoxy resin loaded with dielectric particles.

7. The interconnect module of claim 6, wherein the dielectric particles include barium titanate particles having an average particle size of approximately 0.2 microns.

8. The interconnect module of claim 5, wherein each of the copper foils has an average surface roughness of approximately 8 nm on a side that receives the coating.

9. The interconnect module of claim 6, wherein the epoxy resin is cured upon lamination of the first conductive layer, the second conductive layer, and the dielectric layer.

10. The interconnect module of claim 6, wherein the dielectric particles are selected from the group consisting of barium titanate, barium strontium titanate, titanium oxide, and lead zirconium titanate.

11. The interconnect module of claim 1, wherein the first dielectric layer has a thickness of less than or equal to approximately 8 microns, and a dielectric constant of at least about 12.

12. The interconnect module of claim 5, wherein each of the copper foils has a thickness no greater than about 12 microns.

13. The interconnect module of claim 1, wherein the capacitor structure has a thickness of less than or equal to approximately 32 microns, and a dielectric constant of at least about 12.

14. The interconnect module of claim 1, wherein the chip attach surface defines an array of the first contact pads to which individual solder ball connections of the integrated circuit chip are connected.

15. The interconnect module of claim 2, wherein the conductive paths include conductive vias that interconnect a plurality of the first contact pads with the third conductive layer, interconnect a plurality of the second contact pads with the fourth conductive layer, and interconnect the third and fourth conductive layers.

16. The interconnect module of claim 2, wherein the first conductive layer is a power layer, the second conductive layer is a ground layer, and the third and fourth conductive layers are signal layers.

17. The interconnect module of claim 2, further comprising:
a first via to interconnect one or more of the first contact pads with the third conductive layer; and
a second via to interconnect the third conductive layer with the first conductive layer, wherein the second via is offset from the first via,
wherein the interconnect module defines an electrical signal path having a first portion in said third conductive layer routed in a direction toward the first conductive via, and a second portion in said first conductive layer routed in a direction toward the second conductive via,
wherein said location of said second conductive via permits a mutual inductance formed by the first portion of the electrical signal path with the second portion of the electrical signal path to cancel a mutual inductance formed by the second portion of the electrical signal path with the first portion of the electrical signal path.

18. The interconnect module of claim 2, comprising further additional conductive layers and additional dielectric layers wherein the additional dielectric layers are made of the same material, and have approximately the same thickness and the same thickness tolerance, and all of the layers are laminated to another to form the interconnect module.

19. The interconnect module of claim 18, wherein the first conductive layer is a power layer, the second conductive layer is a ground layer, and the further additional conductive layers are signal layers.

20. The interconnect module of claim 1, wherein the capacitor structure is a first capacitor structure, the interconnect module further comprising:
a second capacitor structure having a third conductive layer, a fourth conductive layer, and a second dielectric layer formed between the third and fourth conductive layers; and
a third dielectric layer formed between the first and second capacitor structures, wherein the conductive paths interconnect a plurality of the second contact pads to the fourth conductive layer.

21. The interconnect module of claim 20, wherein each of the first and second dielectric layers has a thickness of less than or equal to approximately 8 microns, and a dielectric constant of at least about 12.

22. The interconnect module of claim 1, wherein the capacitor structure is pre-tested for satisfactory electrical operation prior to incorporation in the interconnect module.

23. The interconnect module of claim 1, further comprising:
a semiconductor chip of the type having a plurality of individual solder ball connections on a mounting surface thereof; and
wherein at least one lamina is formed by lamination of least two layers of the interconnect module, at least one dielectric layer and at least one conductive layer, at least one lamina comprising a dielectric layer being formed at least in part from polytetrafluoroethylene having disposed therein an inorganic filler material,
wherein at least one via extends through said at least one lamina, said via having an entrance aperture in the conductive layer of less than 75 $\mu$m and an aspect ratio of between 3:1 and 25:1, and
wherein the contact pads of the interconnect module are connected to the individual solder ball connections of said semiconductor chip.

24. The interconnect module of claim 1, further comprising:
an integrated circuit chip mounted on the chip attach surface of the interconnect module; and
a lid having at least two regions exhibiting different coefficients of thermal expansion, wherein one of said regions has a coefficient of thermal expansion that substantially matches an in plane coefficient of thermal expansion of the integrated circuit chip, and wherein said other of said regions has a coefficient of thermal expansion that substantially matches an in plane coefficient of thermal expansion of said interconnect.

25. The interconnect module of claim 24, wherein the lid is made of a metallic material disposed in a matrix material having at least one opening and further comprises a preform having at least two thicknesses, and an insert fitted into said at least one opening, wherein the insert is made of a second material having a different coefficient of thermal expansion.

26. The interconnect module of claim 24, wherein the lid is connectable to the interconnect module through a constraining ring, and wherein a second region of the lid has a coefficient of thermal expansion that substantially matches an in plane coefficient of thermal expansion of the constraining ring.

27. The interconnect module of claim 25, wherein the matrix material is silicon carbide and the metallic material is aluminum.

28. The interconnect module of claim 1, further comprising a plurality of additional dielectric and conductive layers arranged in alternatingly disposed, vertically stacked dielectric and conductive layers about a plane of symmetry passing through the capacitor structure,
wherein the additional dielectric layers include second and third dielectric layers disposed respectively on opposite sides of the capacitor structure, and the second and third dielectric layers are made of the same material, and have approximately the same thickness and the same thickness tolerance,
wherein outer-most layers of the stack are conductive layers having substantially the same thickness, and the thickness of the outer-most conductive layers are thicker than any other conductive layers,
wherein a plurality of said additional dielectric layers have a higher elastic modulus relative to said other dielectric layers, wherein said plurality of said dielectric layers having said higher elastic modulus are arranged outwardly, from said horizontal plane of symmetry, relative to said other dielectric layers such that the flexural modulus of said laminated substrate is substantially maximized.

29. The interconnect module of claim 3, further comprising at least one additional conductive layer; and at least one additional dielectric layer bonded to the conductive layer, the dielectric layer having a glass transition temperature $T_g$ greater than 200° C. a volumetric coefficient of thermal expansion 75 ppm/° C., and wherein and the dielectric layer is an organic material having an inorganic filler material; and a chip electrically attached to the chip attach surface.

30. The interconnect module of claim 29, wherein the at least one conductive layer and the at least one dielectric layer are bonded together so that the thickness of the resulting laminated substrate is between about 25 microns and about 750 microns.

31. The interconnect module of claim 30, wherein the additional dielectric layer is selected from the group consisting of polyimides, polyimide laminates, epoxy resins, liquid crystal polymers and fluoropolymers.

32. The interconnect module of claim 1, further comprising at least one via extending through at least an outermost dielectric layer of the interconnect module, each via having an entrance aperture and each respective entrance aperture having an entrance width no greater than about 75 $\mu$m, wherein at least one via is a through-via having an aspect ratio at least about 10:1 and an exit with a variance in width of about 10 $\mu m^2$.

33. The interconnect module of claim 32, wherein the outermost dielectric layer is a high-temperature organic dielectric substrate material selected from the group consisting of polyimides, epoxy resins, polytetrafluoroethylene, and liquid crystal polymer adhesive bonded to the interconnect module.

34. The interconnect module of claim 32, wherein at least one via is a blind via having an aspect ratio equal to or greater than 1:1.

35. A method for forming an interconnect module, the method comprising:
   providing a laminated capacitor structure having a first conductive layer, a second conductive layer, and a dielectric layer formed between the first and second conductive layers and laminated into a unitary structure;
   forming a chip attach surface defining first contact pads for attachment of an integrated circuit chip to the interconnect module on a first side of the capacitor structure;
   forming a board attach surface defining second contact pads for attachment of the interconnect module to a printed wiring board on a second side of the capacitor structure;
   coupling the capacitor structure, the chip attach surface, and the board attach surface to form the interconnect module; and
   forming conductive paths that interconnect a plurality of the first contact pads to the first conductive layer,
   wherein the first contact pads, the conductive paths, and the capacitor structure produce a combined impedance of less than or equal to approximately 0.60 ohms at a frequency of greater than or equal to approximately 1.0 gigahertz.

36. The method of claim 35, further comprising the steps of forming additional dielectric layers and additional conductive layers:
   forming a second dielectric layer between the first conductive layer and the chip attach surface;
   forming a third conductive layer between the second dielectric layer and the chip attach surface;
   forming a third dielectric layer between the second conductive layer and the board attach surface; and
   forming a fourth conductive layer between the third dielectric layer and the board attach surface.

37. The method of claim 36, wherein the additional dielectric layers are formed from an expanded polytetrafluoroethylene matrix containing a mixed cyanate ester-epoxy adhesive and inorganic filler, the method further comprising laminating all of the layers together to form a laminated package.

38. The method of claim 36, further comprising forming the conductive paths to include conductive vias that interconnect at least one of the first contact pads with the third conductive layer, interconnect a plurality of the second contact pads with the fourth conductive layer, and interconnect portions of the third and fourth conductive layers.

39. The method of claim 36, wherein the first conductive layer is a power layer, the second conductive layer is a ground layer, and the additional conductive layers are signal layers.

40. The method of claim 35, wherein the chip attach surface defines an array of the first contact pads to which individual solder ball connections of the integrated circuit chip are connected.

41. The method of claim 35, wherein the conductive paths are formed to include vias that interconnect a plurality of the first contact pads with the first and second conductive layers to distribute power from the first conductive layer and a ground potential from the second conductive layer.

42. The method of claim 35, further comprising laminating the first conductive layer, the second conductive layer, and the dielectric layer together before forming the interconnect module.

43. The method of claim 42, wherein the first and second conductive layers are copper foils, and the first dielectric layer is a coating of dielectric material formed on at least one of the copper foils.

44. The method of claim 43, wherein the dielectric material includes an epoxy resin loaded with dielectric particles selected from the group consisting of barium titanate, barium strontium titanate, titanium oxide, and lead zirconium titanate.

45. The method of claim 44, wherein the dielectric particles include barium titanate particles having an average particle size of approximately 0.2 microns.

46. The method of claim 43, wherein each of the copper foils has an average surface roughness of approximately 8 nm on a side that receives the coating.

47. The method of claim 44, wherein the epoxy resin is cured during the lamination of the first conductive layer, the second conductive layer, and the first dielectric layer.

48. The method of claim 43, wherein the first dielectric layer has a thickness of less than or equal to approximately 8 microns, and a dielectric constant of greater than or equal to approximately 12, each of the copper foils in the laminated capacitor structure has a thickness of from about 10 microns to about 40 microns.

49. The method of claim 36, further comprising:
   forming a first conductive via selected from the group consisting of a blind via, a through-via and a buried via to interconnect one or more of the first conductive pads with the third conductive layer;
   forming a second conductive via selected from the group consisting of a blind via, a through-via and a buried via to interconnect the third conductive layer with the first conductive layer, wherein the second conductive via is offset from the first conductive via, and
   the interconnect module defines an electrical signal path having a first portion in said third conductive layer routed in a direction toward the first conductive via, and a second portion in said first conductive layer routed in a direction toward the second conductive via,
   wherein said location of said second conductive via permits a mutual inductance formed by the first portion of the electrical signal path with the second portion of the electrical signal path to cancel a mutual inductance formed by the second portion of the electrical signal path with the first portion of the electrical signal path.

50. The method of claim 36, comprising providing further additional conductive and dielectric layers, laminating all of the provided layers together to form a laminated package, wherein further additional dielectric layers are made of the same material, and have approximately the same thickness and the same thickness tolerance.

51. The method of claim 36, wherein the first conductive layer is a power layer, the second conductive layer is a ground layer, and any additional conductive layers are signal layers.

52. The method of claim 35, wherein the capacitor structure is a first capacitor structure, the method further comprising:
   forming a second capacitor structure having a third conductive layer, a fourth conductive layer, and a second dielectric layer between the third and fourth conductive layers; and
   forming a third dielectric layer between the first and second capacitor structures, wherein the conductive paths interconnect a plurality of the first and second contact pads to the fourth conductive layer, wherein each of the first and second dielectric layers has a thickness of less than or equal to approximately 8 microns, and a dielectric constant of greater than or equal to approximately 12.

53. The method of claim 35, further comprising the step of pre-testing the capacitor structure for satisfactory electrical operation prior to incorporation in the interconnect module.

54. The method of claim 36, further comprising the steps of:
   forming a second dielectric layer on the first conductive layer;
   forming an exposed third conductive layer on the second dielectric layer, the third conductive layer having a preformed aperture;
   laser drilling through the second dielectric layer to the first conductive layer to form a blind via at a location within the preformed aperture of the third conductive layer using a plurality of laser pulses each having a first energy density per pulse, the first energy density per pulse being greater than an ablation threshold of the second dielectric layer and less than an ablation threshold of the first conductive layer; and
   laser drilling the first conductive layer for a predetermined number of pulses each having a second energy density per pulse, the second energy density being greater than an ablation threshold of the first conductive layer, the predetermined number of pulses causing a surface of the first conductive layer exposed by the laser drilling to become molten.

55. The method according to claim 54, further comprising the step of filling the blind via with a conductive material.

56. The method according to claim 36, wherein the third conductive layer has a plurality of preformed apertures, and the method further comprises the step of forming a plurality of blind vias by performing the step of laser drilling through the second dielectric layer to the first conductive layer to form a blind via at a location within at least two preformed apertures of the first conductive layer and the step of laser drilling the third conductive layer at each blind via in situ.

57. The method of claim 35, further comprising:
   placing a first mask between an output optics of a laser and an exposed surface of a laminated interconnect module, the first mask having a first aperture corresponding to a location of a via in the interconnect module;
   placing a second mask between the first mask and the output optics of the laser, the second mask having a second aperture disposed within a main beam of a laser beam output from the laser, the second aperture blocking side lobes of the laser beam from reaching the exposed surface of the interconnect module;
   laser drilling a via in the interconnect module,
   applying a polymeric photo-absorptive layer on the exposed surface of the interconnect module;
   forming ablated material by laser drilling the via in the interconnect module through the photo-absorptive layer;
   redepositing the ablated material on the photo-absorptive layer surrounding the via; and
   enhancing an entrance of the via by removing the photo-absorptive layer and the ablated redeposited material on the photo-absorptive layer.

58. The method of claim 35, further comprising:
   laser drilling a through-via in the interconnect from a top exposed surface of the interconnect to a bottom exposed surface of the interconnect using a plurality of laser pulses that are trepanned in a first predetermined pattern, each pulse trepanned in the first predetermined pattern having a first energy density per pulse; and
   laser drilling the through-via using a plurality of laser pulses that are trepanned in a second predetermined pattern, each pulse trepanned in the second predetermined pattern having a second energy density per pulse, the second energy density per pulse being greater than the first energy density per pulse, the second predetermined pattern being within the first predetermined pattern.

59. The method according to claim 58, further comprising:
   applying a polymeric photo-absorptive layer on the exposed top surface of the interconnect before laser drilling the interconnect;
   forming ablated material by laser drilling the through-via in the interconnect through the photo-absorptive layer;
   redepositing the ablated material on the photo-absorptive layer surrounding the aperture; and
   enhancing an entrance of the through-via by removing the photo-absorptive layer and the ablated redeposited material on the photo-absorptive layer.

60. A method according to claim 36, wherein the additional conductive layers are made of a material selected from the group consisting of copper, gold, silver and aluminum.

61. The method of claim 35, further comprising:
   forming third and fourth conductive layers of the same type of material;
   patterning one of the third and fourth layers to form an electrical circuit pattern, thereby forming a patterned layer having a distribution of material; and
   altering the distribution of material in the other of the third and fourth conductive layers to match that of the patterned layer.

62. A method for making an interconnect module according to claim 35 comprising:
   laminated alternating conductive and dielectric layers about a central laminated capacitor structure;
   forming one or more blind vias through the conductive and dielectric layers;
   filling the blind vias with a conductive material to define conductive paths between the laminated capacitor structure and outer conductive layers of the interconnect module;

plating the blind vias; and patterning the outer conductive layers to form contact pads over the blind vias, wherein the contact pads, the conductive paths, and the capacitor structure produce a combined power distribution impedance of less than or equal to approximately 0.60 ohms at a frequency of greater than or equal to approximately 1.0 gigahertz.

63. An interconnect module comprising:

a laminated capacitor structure;

alternating conductive and dielectric layers laminated to opposite sides of the capacitor structure; and one or more blind vias extending through the conductive and dielectric layers, wherein the blind vias are plated and filled with a conductive material to define conductive paths between the laminated capacitor structure and outer conductive layers of the interconnect module, and wherein the contact pads, the conductive paths, and the capacitor structure produce a combined power distribution impedance of less than or equal to approximately 0.60 ohms at a frequency of greater than or equal to approximately 1.0 gigahertz.

* * * * *

UNITED STATES PATENT AND TRADEMARK OFFICE
CERTIFICATE OF CORRECTION

PATENT NO.     : 6,847,527 B2
DATED          : January 25, 2005
INVENTOR(S)    : Sylvester, Mark F.

It is certified that error appears in the above-identified patent and that said Letters Patent is hereby corrected as shown below:

Column 12,
Line 62, delete "136" and insert -- 138 -- therefor.

Column 18,
Line 7, after "Schenk" delete "A G" and insert -- AG -- therefor.

Signed and Sealed this

Twenty-eighth Day of June, 2005

JON W. DUDAS
*Director of the United States Patent and Trademark Office*